United States Patent [19]

Carlson et al.

[11] 4,060,660
[45] Nov. 29, 1977

[54] DEPOSITION OF TRANSPARENT AMORPHOUS CARBON FILMS

[75] Inventors: David Emil Carlson, Yardley, Pa.; Chester Edwin Tracy, Skillman, N.J.

[73] Assignee: RCA Corporation, New York, N.Y.

[21] Appl. No.: 649,548

[22] Filed: Jan. 15, 1976

[51] Int. Cl.² .............................................. B05D 3/06
[52] U.S. Cl. ............................... 428/408; 204/173; 427/39; 427/122; 428/426
[58] Field of Search ................ 427/39, 101, 122; 204/173, 164; 428/408, 426

[56] References Cited

U.S. PATENT DOCUMENTS

| 3,167,449 | 1/1965 | Spacil | 204/173 |
| 3,854,979 | 12/1974 | Rossi | 428/408 |

FOREIGN PATENT DOCUMENTS

| 1,582,045 | 8/1969 | France | 427/39 |

Primary Examiner—John H. Newsome
Attorney, Agent, or Firm—H. Christoffersen; Birgit E. Morris; Daniel N. Calder

[57] ABSTRACT

Applying a D. C. glow discharge to a heated glassy substrate in an evacuated chamber to which a volatile hydrocarbon has been added, produces a glassy substrate coated with a hard, transparent, resistive, amorphous carbon coating.

8 Claims, 1 Drawing Figure

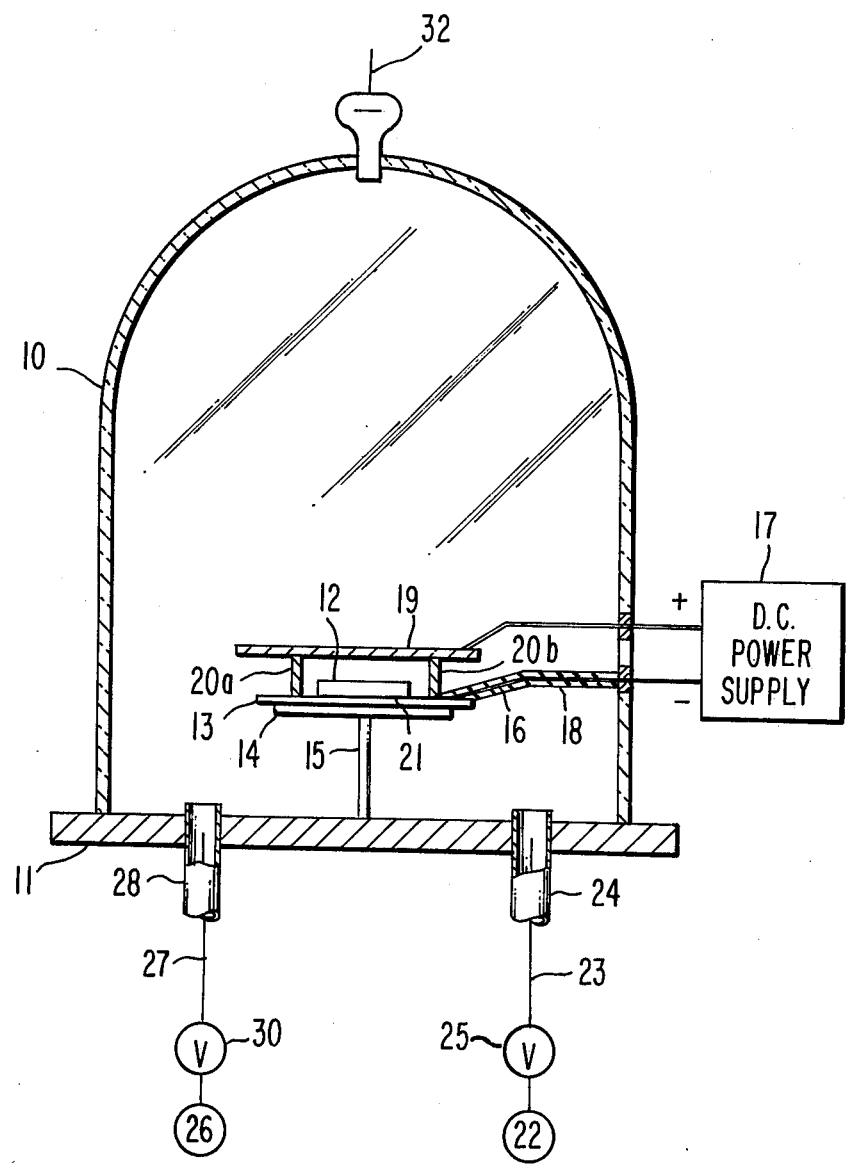

DEPOSITION OF TRANSPARENT AMORPHOUS CARBON FILMS

This invention relates to a method of depositing amorphous carbon coatings on glassy substrates. More particularly, this invention relates to a method of depositing transparent, resistive amorphous carbon films on glassy substrates in a D.C. glow discharge.

BACKGROUND OF THE INVENTION

Pagnia, Phys. Status Solidi 1, 90–93 (1961) and Carbojal III, Trans. Metal Soc. AIME 236, 364–369 (1966) describe the preparation of D.C. glow discharge polymerized films from a hydrocarbon. Pagnia forms the films at the anode, while Carbojal III forms the films behind a screen cathode.

Carbojal III et al in U.S. Pat. No. 3,344,055, again by forming a film behind a screen cathode using a D.C. glow discharge, describe not only the preparation of polymer films, but also describe the preparation of oxides, nitrides or carbides of metals or semi-metals. These films are formed at ambient temperatures.

Hough, in U.S. Pat. No. 3,386,909, describes the preparation of pyrolytic graphite by deposition on a filamentary substrate moving through a gaseous suspension of ionized particles of a methane series gas.

Papp, in U.S. Pat. 3,108,900, describes a process and apparatus of producing, inter alia, a carbide coating on metal by glow discharge of a hydrocarbon.

Our copending application, Ser. No. 544,569, filed Jan. 27, 1975, now U.S. Pat. No. 3,991,228 discloses a method of producing transparent tin oxide films on a glass substrate in a D.C. glow discharge with the substrate serving as the cathode. Pertinent portions of this application are incorporated by reference herein.

U.S. Application Ser. No. 527,054, filed Nov. 25, 1974, now U.S. Pat. No. 3,981,559 for Channin, describes, inter alia, interleaved electrodes and a planar electrode to form a triode optical gate for controlling the display of a liquid crystal device. A resistive film may be located in conductive contact with the interleaved electrode. It would be desirable to apply a carbon resistive film having a room temperature resistivity of from $10^9$ ohm/sq. to $10^7$ ohm/sq. provided such film could be made.

SUMMARY OF THE INVENTION

We have found that glassy substrates can be surface coated with transparent, amorphous carbon films having a room temperature surface resistive of from about $10^{12}$ ohm/sq. to about $10^4$ ohm/sq., under proper conditions in a D.C. glow discharge. Films with a room temperature surface resistance of from about $10^{12}$ ohm/sq. to about $10^7$ ohm/sq. are preferred and from about $10^9$ ohm/sq to $10^7$ ohm/sq. are most preferred. According to our novel method, a glow discharge is applied to heated glassy substrates in an evacuated chamber containing small amounts of a hydrocarbon. "Glassy substrates", as used herein, include both glass and ceramic substrates.

BRIEF DESCRIPTION OF THE DRAWING

The sole FIGURE is a schematic diagram of an apparatus useful for depositing an amorphous carbon film on a substrate.

DETAILED DESCRIPTION OF THE INVENTION

According to our process, high quality amorphous carbon coatings can be applied to a glassy substrate by heating the glassy substrate within a temperature range from about 300° to 550° C., but below the softening temperature of the substrate, in a vacuum chamber. A volatile hydrocarbon, such as methane, ethylene, acetylene or benzene, is introduced into the vacuum chamber and a D.C. glow discharge is applied to the glass at a current density of from about 0.05 to about 1.0 mA/cm$^2$, with about 0.2 mA/cm$^2$ being preferable. Using a discharge voltage of about 400V at a pressure of about 0.75 torr for a period of about 15 seconds to about 3 minutes, a high quality, transparent, resistive, amorphous carbon coating forms on the surface of the glassy substrate. The thin films, formed on the cathode, exhibit a large decrease in surface resistance with increasing substrate temperature.

The carbon films are amorphous when deposited at 300° C. and, although still amorphous at 500° C., become more crystalline (more graphite-like) as the temperature increases. Thus, the decrease in surface resistance with increasing temperature appears to be related to a gradual transition from more amorphous carbon which is deposited at 300° C., to less amorphous carbon (more graphite-like) which is deposited at 550° C. Thus, the temperature will be chosen depending upon the properties desired in the deposited carbon film. At 550° C. the carbon film has a surface resistance of about $10^4$ ohm/sq. and a volume resistivity of about $2 \times 10^{-2}$ ohms-cm (about 200A thick). The volume resistivity for graphite is about $1.4 \times 10^{-3}$ ohms-cm.

The anode material used also has a large effect on the surface resistance of the deposited films. A catalytic anode, e.g., platinum or palladium, permits a reduction in the deposition temperature of as much as 110° C. for a given resistance film. This is apparently due to a catalytic dehydrogenation effect that creates chemically activated species in the hydrocarbon discharges.

Films about 200 angstroms thick, having surface resistances greater than about $10^6$ ohm/sq., are strongly adherent to the glassy substrates and are also fairly abrasion-resistant. More conductive films are less adherent because the films are more graphite-like in structure.

Referring now to the FIGURE, the reactions are carried out in a vacuum chamber 10, which is sealed to a baseplate 11. The glassy substrate 12 to be coated is mounted on an insulating platform 13 heated by a heater 14. The heater 14 is supported by a fused silica pedestal 15. The substrate 12 also acts as the cathode during glow discharge and is connected to the negative lead 16 of a high voltage D.C. power supply 17, capable of supplying a current of about 1.0 mA per cm$^2$ of cathode area and having a voltage rating of about 2 kV. The negative lead 16 is suitably a thin coated platinum wire which is shielded, by a fused silica or fiberglass tubing 18, in those portions not in contact with the substrate 12. A metal sheet 19, which acts as the anode during glow discharge, is connected to the positive lead of the power supply 17 and is positioned parallel to and about 2 cm above the glassy substrate 12 by means of ceramic spacers 20a and 20b. The metal sheet 19 is preferably perforated and can be a conductive metal grid or screen, as of steel, aluminum, platinum and the like. The substrate 12 is coated on the side away from the anode 19 with a conductive coating 21, as of silver or graphite, so that current is passed through the glass substrate 12 during glow discharge. By applying a high voltage to the electrodes 12 and 19, a glow discharge is produced between them.

The vacuum chamber 10 can be evacuated by an evacuating pump 22 connected by means of an exit line 23 through an exit port 24 of the baseplate 11 and is monitored by a valve 25.

A storage unit 26 for the volatile hydrocarbon is connected to the vacuum chamber 10 by means of a feed line 27 to the inlet port 28 through the baseplate 11. The pressure inside the vacuum chamber 10 is monitored by means of a gauge 32, which can be a thermocouple vacuum gauge or a McLeod gauge.

It will be understood that various modifications of the above-described apparatus can be made. In the event the vacuum chamber 10 is mounted in a furnace, the heater 14 becomes unnecessary. When the heater is omitted, the glassy substrate 12, when properly mounted and shielded, can be contacted by glow discharge on both sides. The surface adjacent to the positive electrode 19 will be coated with a thin amorphous carbon film.

In using the above apparatus to deposit amorphous carbon films, the vacuum chamber 10 is first evacuated by means of the vacuum pump 22 to its ultimate pressure while heating the glassy substrate 12 to the desired temperature with the heater 14. Suitable temperatures can be from about 300° C. up to the softening temperature of the glassy substrate, but, preferably is below about 550° C. The valve 25 connected to the vacuum pump 22 is then shut off and the volatile hydrocarbon is bled into the vacuum chamber 10 by means of the valve 30 through the feed line 27 up to the desired pressure as measured by the gauge 32. The final vapor pressure in the vacuum chamber 10 is suitably from about 0.5 to about 2.0 torr, preferably about 1.0 torr.

The current is then turned on. A current density between about 0.05 to about 1.0 mA/cm$^2$ should be maintained. The current density in general is directly proportional to the rate of deposition of the amorphous carbon film. Excellent films about 200A thick can be deposited in about 30 seconds when the current density is about 0.2 mA/cm$^2$ in a pressure of about 0.75 torr.

The minimum voltage for deposition can be determined by adjusting the applied voltage so that the glow of the discharge just covers the entire surface of the substrate to be coated. Operation near the minimum voltage assures uniform amorphous carbon deposition while minimizing sputtering effects. The applied voltage may be increased during deposition if required. In the case where high alkali-containing glasses are employed as substrates, the glassy surface being coated becomes alkali depleted, whereby its resistance increases and a higher applied voltage may be required for continued deposition.

The current is maintained for a period of about 15 seconds to about 3 minutes, depending on the current density, to deposit films of the desired thickness, generally from about 100 to 200A. When the proper film thickness is obtained, the glow is extinguished.

When the amorphous carbon coating is to be applied in a patterned configuration, a suitable mask can be placed over the exposed surface of the glassy substrate 12.

The invention will be further illustrated by the following Examples, but it is to be understood that the invention is not meant to be limited to the details described therein.

EXAMPLE 1

In a vacuum chamber, as in the FIGURE, a soda-lime-silicate glass plate having a glass composition of about 73% $SiO_2$, 13.5% $Na_2O$, 9% CaO, 4% MgO, and 0.2% $Al_2O_3$, all percentages by weight, was mounted as the cathode and a perforated platinum plate was mounted as the anode about 2 cm above and parallel to the glass plate. The vacuum chamber was evacuated to a pressure of about 10 microns (0.01 torr) of air while heating the glass plate to a temperature of about 500° C. Ethylene was added to the chamber to a reading of 750 microns (0.75 torr) on a thermocouple pressure gauge calibrated for air.

A voltage of 700 volts was applied such that about 400 volts was across the gap between the anode and the cathode and about 300 volts was across a $10^5$ ohm limiting resistor to prevent arcing. The current density was maintained at a constant level of 0.2 mA/cm$^2$ for a deposition time of 30 seconds.

A coating of amorphous carbon was deposited on the glass plate, while at the same time the glass surface under the coating was alkali ion depleted to a depth of about 2300A. The amorphous carbon film had a thickness of about 200A, a surface resistance of $4 \times 10^4$ ohm/sq. and a bulk resistivity of about $8 \times 10^{-2}$ ohm-cm.

EXAMPLE 2 - 4

The procedure of Example 1 was followed except that the glass substrates were heated to about 350° C. using differnet hydrocarbons. The surface resistivities are tabulated below in Table I. The pressures in the vacuum chamber were measured with a McLeod gauge. Film thicknesses were measured with a stylus profilometer, and was about 200A for all films.

TABLE I

| Example | Hydrocarbon | Surface Resistance, Ohms/sq. |
|---|---|---|
| 2 | methane | $3 \times 10^8$ |
| 3 | ethylene | $10^9$ |
| 4 | benzene | about $10^{12}$ |

EXAMPLE 5 - 8

The procedure of Example I was followed except that the glass plates were heated to different temperatures. The film thickness was about 200A for all films.

TABLE II

| Example | Temperature | Surface Resistance, Ohm/sq. |
|---|---|---|
| 5 | 300 | $10^{12}$ |
| 6 | 350 | $10^9$ |
| 7 | 400 | $10^7$ |
| 8 | 550 | $10^4$ |

Films formed from a glow discharge in ethylene, show no evidence of C—H bonding in the IR absorption spectra even when the substrate temperature is as low as 300° C.

EXAMPLE 9 - 10

The procedure of Example I was followed except that the glass plates were heated to about 500° C., deposition time was about 2 minutes and the current density was varied. The variation of surface resistivity with current density can be seen from Table III below:

TABLE III

| Example | Current Density mA/cm$^2$ | Surface Resistance, ohm/sq. |
|---------|---------------------------|------------------------------|
| 9       | 0.05                      | $4 \times 10^5$              |
| 10      | 0.20                      | $9 \times 10^3$              |

EXAMPLE 11

The procedure of Example 1 was followed except that a ceramic substrate (Alsimag 614), which is mainly Al$_2$O$_3$, was heated to a temperature of 450° C. A film of amorphous carbon with a resistance $6 \times 10^8$ ohms/sq. was deposited on the substrate.

EXAMPLE 12

The procedure of Example 1 was followed except that a steel plate was used as an anode. At a substrate temperature of 450° C. the film had a surface resistance of $8 \times 10^{10}$ ohms/sq. whereas a film deposited at that substrate temperature using a platinum anode had a surface resistance of $8 \times 10^5$ ohms/sq. The substrate temperature had to be increased to about 510° C. before a film was obtained with a surface resistance of about $8 \times 10^5$ ohms/sq. using a steel anode.

We claim:

1. A method of depositing a transparent, resistive, amorphous carbon film on a glassy substrate which comprises:
   a. heating said glassy substrate to a temperature in the range of from about 300° to 550° C. but below the softening temperature of the substrate in an evacuated chamber,
   b. introducing a volatile hydrocarbon into said evacuated chamber,
   c. applying a D.C. glow discharge between two electrodes situated in said chamber, the cathode of which is said glassy substrate, at a current density of from about 0.05 to about 1.0 mA/cm$^2$ for a period of about 15 seconds to about 3 minutes, so that said glassy substrate becomes coated with an amorphous carbon film.

2. The method of claim 1, wherein the current density is about 0.2 mA/cm$^2$ for about 30 seconds in a pressure of about 0.75 torr.

3. The method of claim 2 wherein the discharge voltage is about 400V.

4. The method of claim 1 wherein the glassy substrate is a soda-lime-silicate glass.

5. The method of claim 1 wherein the glassy substrate is a ceramic.

6. An amorphous carbon film produced by the method of claim 1.

7. A transparent amorphous carbon film having a room temperature surface resistance of from about $10^{12}$ ohm/sq. to about $10^7$ ohm/sq.

8. A transparent amorphous carbon film of claim 7 having a room temperature surface resistance of from about $10^9$ ohm/sq. to about $10^7$ ohm/sq.

* * * * *

UNITED STATES PATENT OFFICE
CERTIFICATE OF CORRECTION

Patent No. 4,060,660     Dated November 29, 1977

Inventor(s) David Emil Carlson et al.

It is certified that error appears in the above-identified patent and that said Letters Patent are hereby corrected as shown below:

Column 1, line 53, "resistive" should read -- resistance --.

Claim 7, line 28, "A transparent" should read -- An --.

Claim 8, line 31, "A transparent" should read -- An --.

Signed and Sealed this

Thirteenth Day of June 1978

[SEAL]

Attest:

RUTH C. MASON
Attesting Officer

DONALD W. BANNER
Commissioner of Patents and Trademarks